United States Patent [19]

Sery et al.

[11] Patent Number: 5,580,807
[45] Date of Patent: Dec. 3, 1996

[54] METHOD OF FABRICATING A HIGH VOLTAGE MOS TRANSISTOR FOR FLASH EEPROM APPLICATIONS HAVING A UNI-SIDED LIGHTLY DOPED GRAIN

[75] Inventors: George E. Sery, San Francisco; Jan A. Smudski, San Jose, both of Calif.

[73] Assignee: Intel Corporation, Santa Clara, Calif.

[21] Appl. No.: 86,140

[22] Filed: Jul. 1, 1993

Related U.S. Application Data

[62] Division of Ser. No. 804,093, Dec. 6, 1991, abandoned.

[51] Int. Cl.$^6$ ............................................... H01L 21/8247
[52] U.S. Cl. ........................... 437/47; 437/43; 437/52; 437/979
[58] Field of Search ........................... 437/47, 979, 52, 437/48, 43; 148/DIG. 109

[56] References Cited

U.S. PATENT DOCUMENTS

| | | | |
|---|---|---|---|
| 3,970,486 | 7/1976 | Kooi | 437/69 |
| 4,128,439 | 12/1978 | Jambotkar | 437/26 |
| 4,401,691 | 8/1983 | Young | 437/13 |
| 4,651,406 | 3/1987 | Shimizu et al. | 437/43 |
| 4,663,645 | 5/1987 | Komori et al. | 257/324 |
| 4,764,248 | 8/1988 | Bhattacherjee et al. | 437/61 |
| 4,814,286 | 3/1989 | Tam | 437/43 |
| 5,034,798 | 7/1991 | Oshima | 257/324 |
| 5,057,448 | 10/1991 | Kuroda | 437/47 |
| 5,061,654 | 10/1991 | Shimuzu et al. | 437/47 |
| 5,075,246 | 12/1991 | Re et al. | 437/47 |
| 5,077,230 | 12/1991 | Woo et al. | 437/43 |
| 5,134,452 | 7/1992 | Yamaguchi et al. | 257/356 |
| 5,156,991 | 10/1992 | Gill et al. | 437/979 |
| 5,242,848 | 9/1993 | Yeh | 437/43 |
| 5,252,505 | 10/1993 | Yatsuda et al. | 437/40 |
| 5,254,489 | 10/1993 | Nakata | 437/40 |
| 5,291,043 | 3/1994 | Arakawa | 257/208 |
| 5,352,620 | 10/1994 | Komori | 437/52 |

FOREIGN PATENT DOCUMENTS

| | | | |
|---|---|---|---|
| 59-55068 | 3/1984 | Japan | 437/47 |

Primary Examiner—Michael Trinh
Attorney, Agent, or Firm—Blakely, Sokoloff, Taylor & Zafman

[57] ABSTRACT

High voltage MOS transistors are fabricated contemporaneously with scaled flash EEPROM array transistors. Active silicon regions separated by field oxide isolation structures are formed as in the prior art. A sacrificial thermal oxide layer simultaneously removes Kooi effect residual nitridization and provides gate oxide for the high voltage transistors of a thickness commensurate with the high voltage application. The sacrificial oxide is thereafter removed from all circuit areas except over high voltage device active areas. Growth of tunnel oxide, first polysilicon, interpoly dielectric, peripheral gate oxide and second polysilicon layers as well as patterning of the layers are accomplished in a known manner. The second polysilicon layer is patterned to create lines which lie within lines formed of the first polysilicon layer, the second polysilicon layer aiding controlling the final channel length of the high voltage devices. A uni-sided lightly doped drain structure is created in n-channel enhancement and intrinsic high voltage devices only by an appropriately shaped mask to block the n+ source-drain implant over a previously implanted tip region disposed between the gate and drain, thereby minimizing hot-carrier effects in the drains. Metallization for the high voltage transistors is made over field oxide to the polysilicon control gates formed from the first polysilicon layer.

7 Claims, 9 Drawing Sheets

FIG_1A (PRIOR ART)
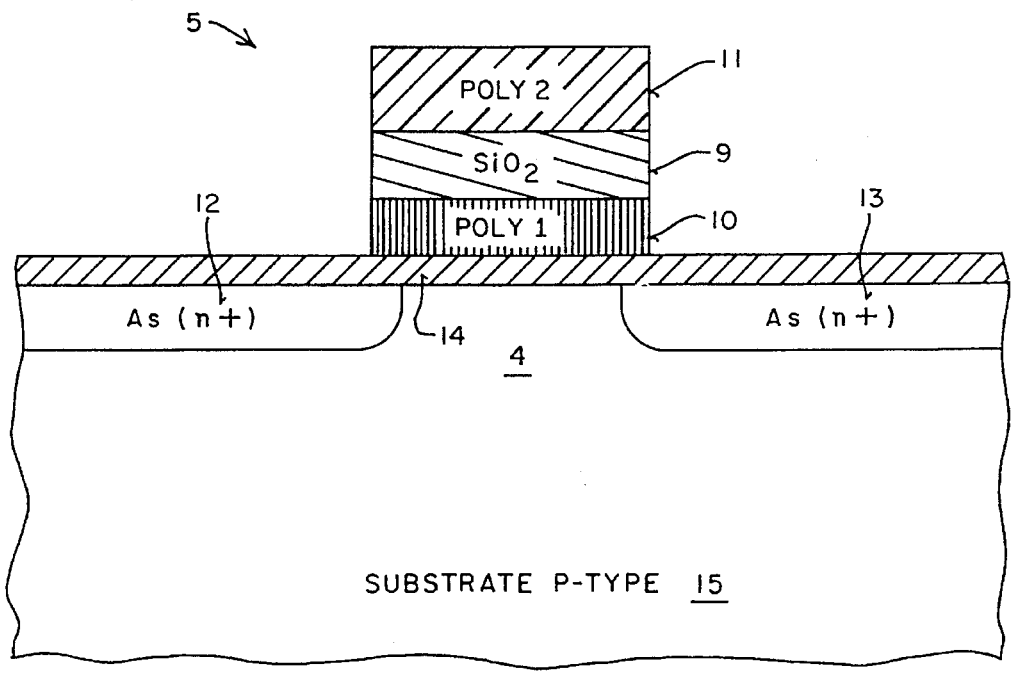
FIG_1B (PRIOR ART)
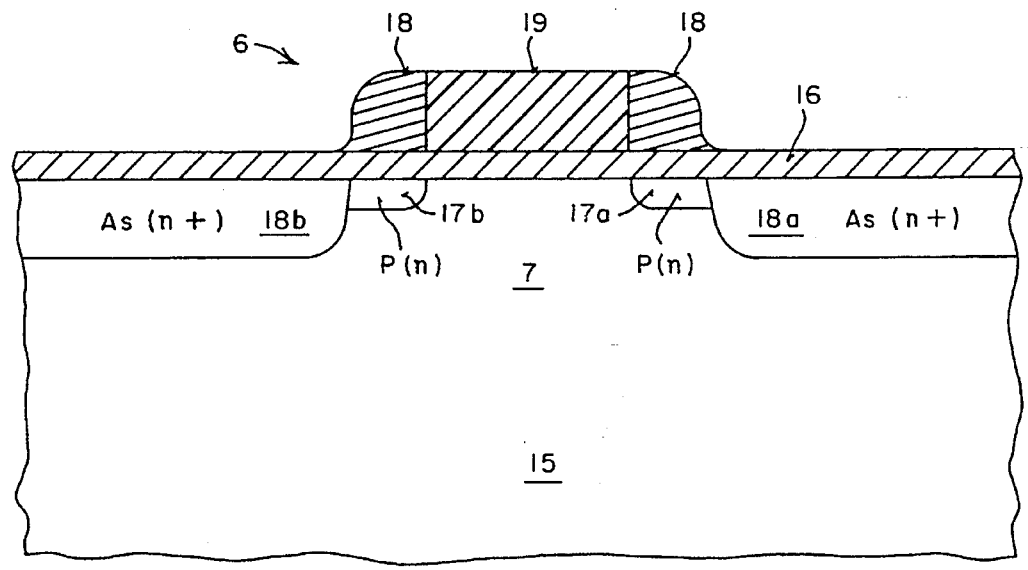

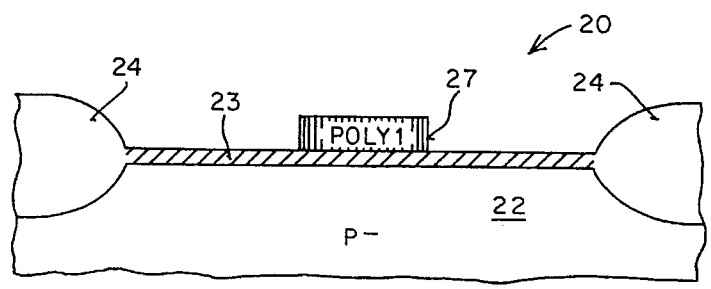
FIG_3A
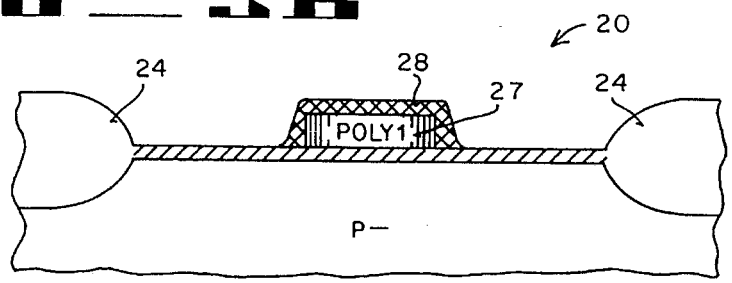
FIG_3B
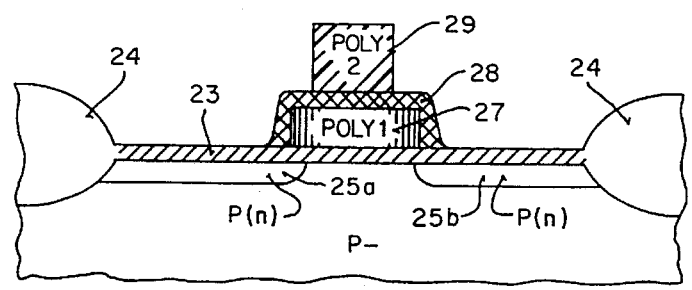
FIG_3C
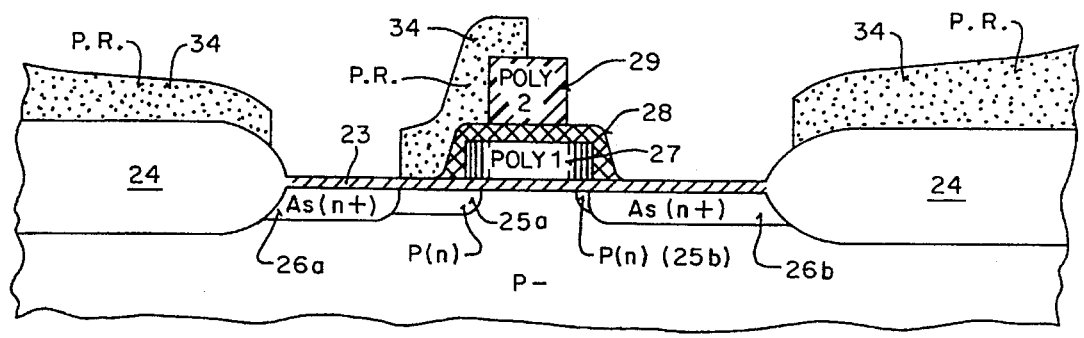
FIG_3D

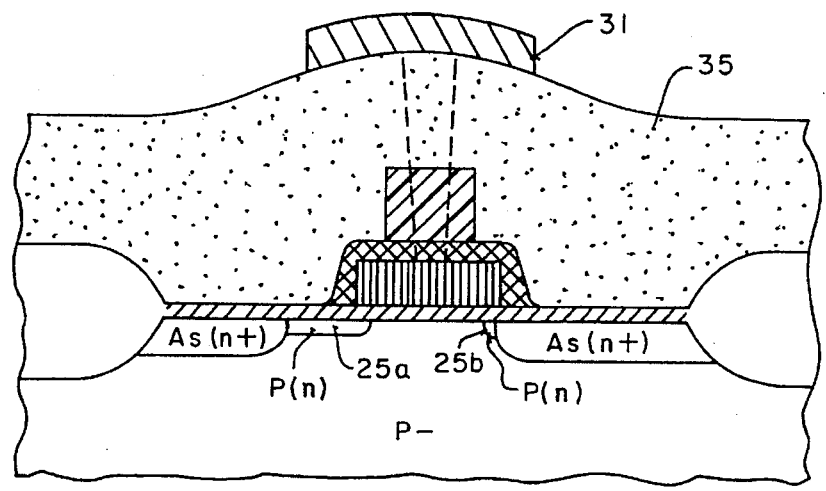
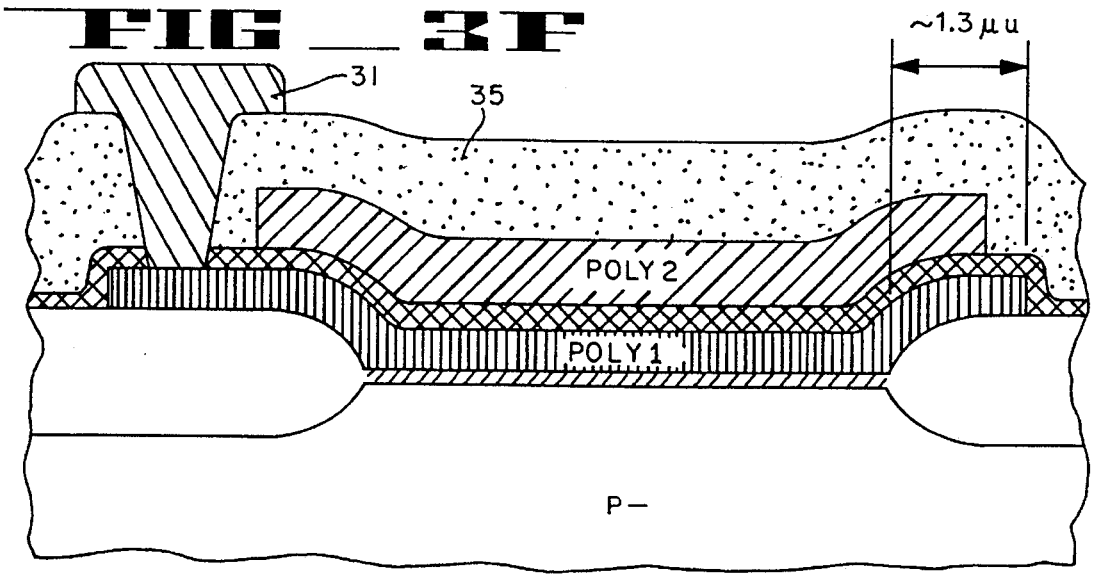

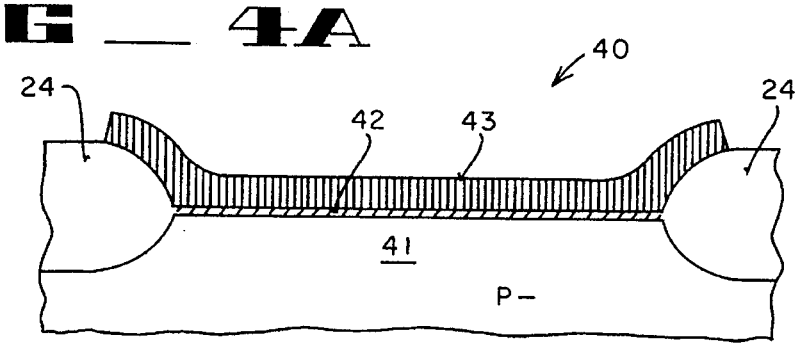
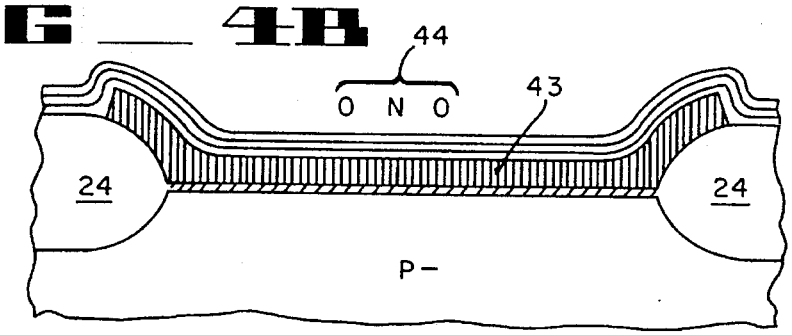
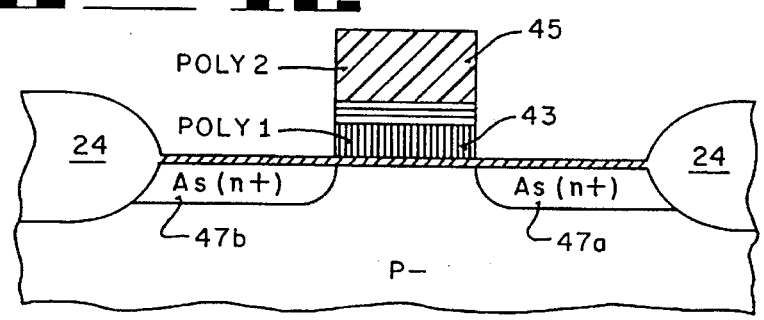
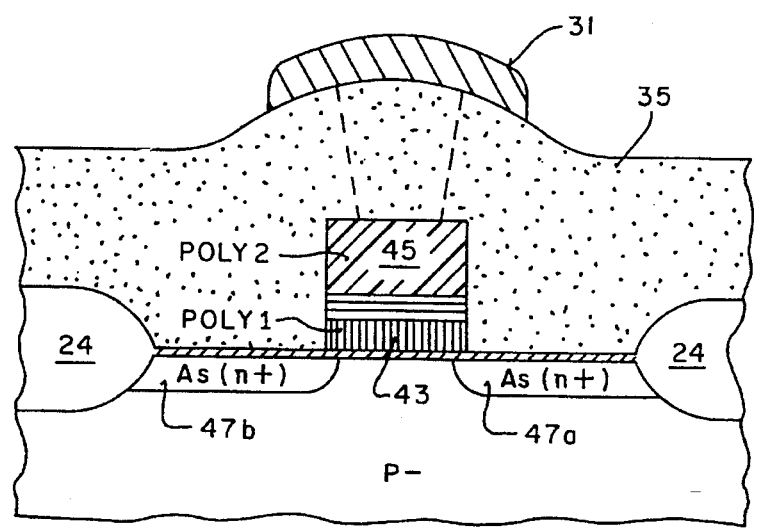

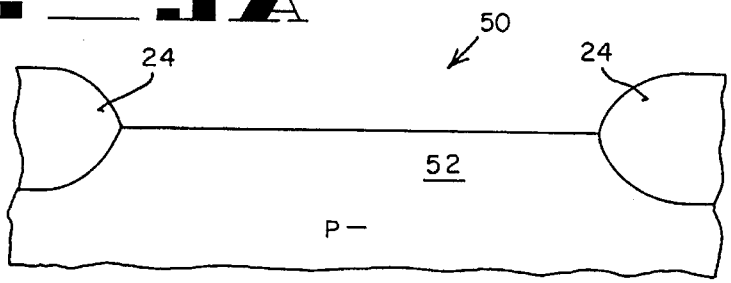
FIG_5A
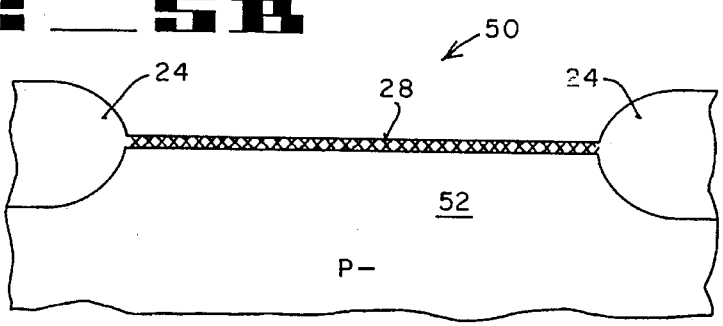
FIG_5B
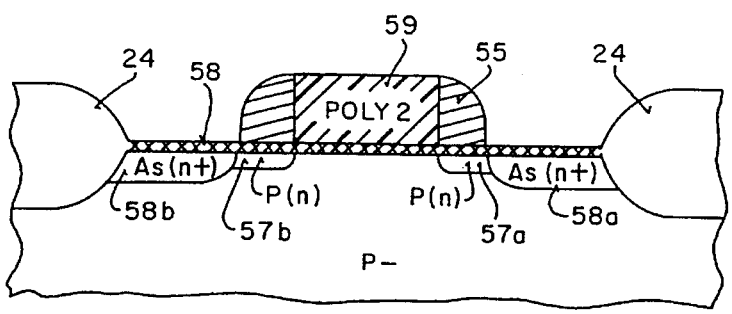
FIG_5C
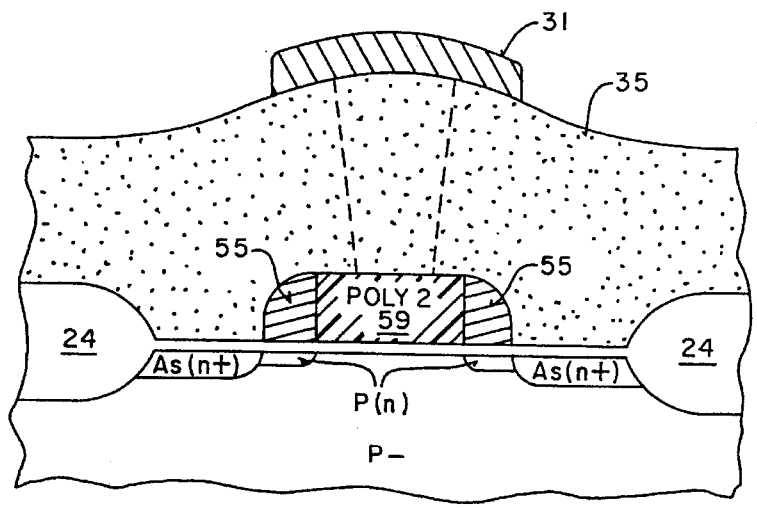
FIG_5D

FIG __ 6

| PROCESS FLOW SPECIFICS | NOMINAL SPEC |
|---|---|
| 1. GROW SACRIFICIAL OXIDE | 350 Å |
| 2. SPIN PHOTORESIST & PATTERN (LITHO) FOR CELL IMPLANTATION | |
| 3. CELL THRESHOLD ADJUSTMENT INPLANT | |
| 4. SACRIFICIAL OXIDE ETCH (OF ARRAY) | |
| 5. HF PRECLEAN | |
| 6. GROW TUNNEL OXIDE | 115 Å |
| 7. DEPOSIT POLY 1 | 1500 Å |
| 8. POLY 1 LITHO | |
| 9. ETCH POLY 1 - (WIDTH) | |
| 10. DEPOSIT INTERPOLY DIELECTRIC LAYER (ONO) | 200-380 Å |
| 11. ONO LITHO | |
| 12. ONO ETCH | |
| 13. GROW PERIPHERAL GATE OXIDE | 175 Å |
| 14. DEPOSIT POLY 2 | 1500 Å |
| 15. POLY 2 IMPLANT | |
| 16. ANNEAL | |
| 17. TUNGSTEN SILICIDE (WSi) DEPOSITION | 2000 Å |
| 18. CELL POLY 2 LITHO | |
| 19. CELL POLY 2, ONO, AND POLY 1 ETCH | |
| 20. CELL SOURCE-DRAIN IMPLANT | |
| 21. PERIPHERY POLY 2 LITHO | |
| 22. PERIPHERY POLY 2 ETCH | |
| 23. FLASH SOURCE LITHO | |
| 24. FLASH SOURCE IMPLANT | |
| 25. CELL REOXIDATION | 2 HOURS - 920°C |
| 26. SHEET PHOSPHOROUS TIP IMPLANT (P2 TO BLOCK) | |
| 27. MASKED BORON TIP IMPLANT (P-CHANNEL) | |
| 28. SPACER OXIDE DEPOSITION | |
| 29. TIP ANNEAL | 1 HOUR @ 920°C |
| 30. SPACER ETCH BACK | |
| 31. HIGH DOSE N+ LITHO & IMPLANT | |
| 32. HIGH DOSE P+ LITHO & IMPLANT | |

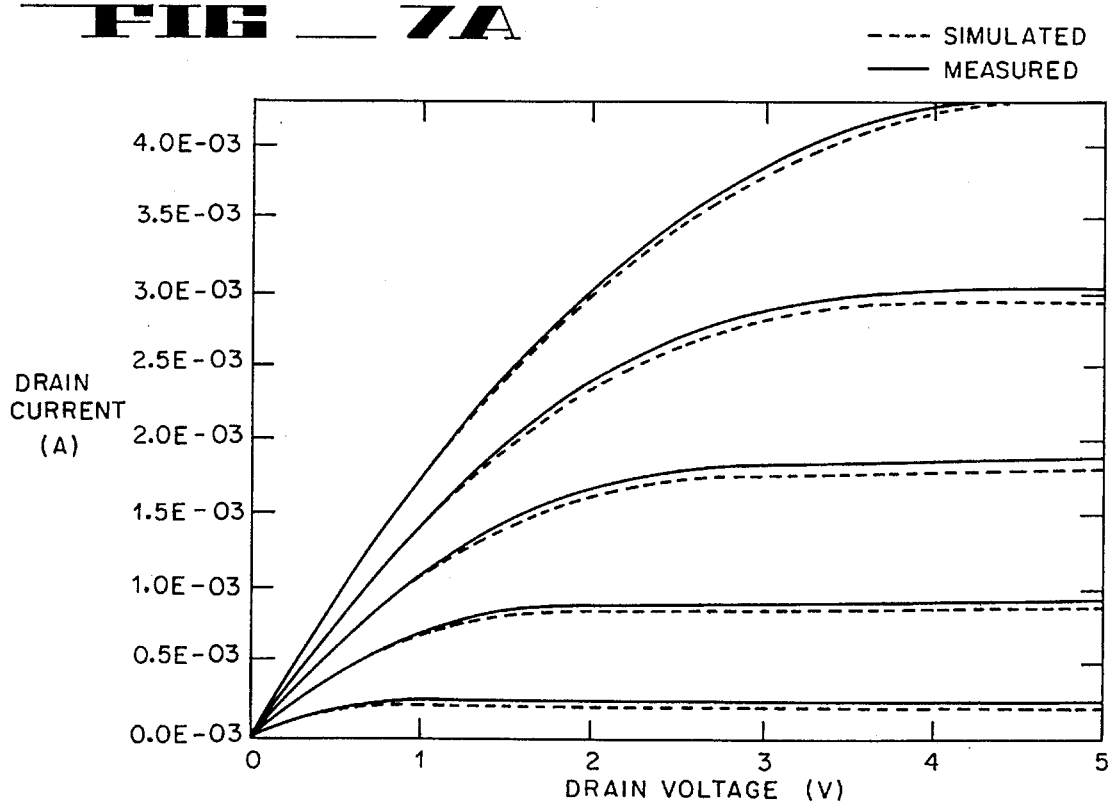
FIG_7A
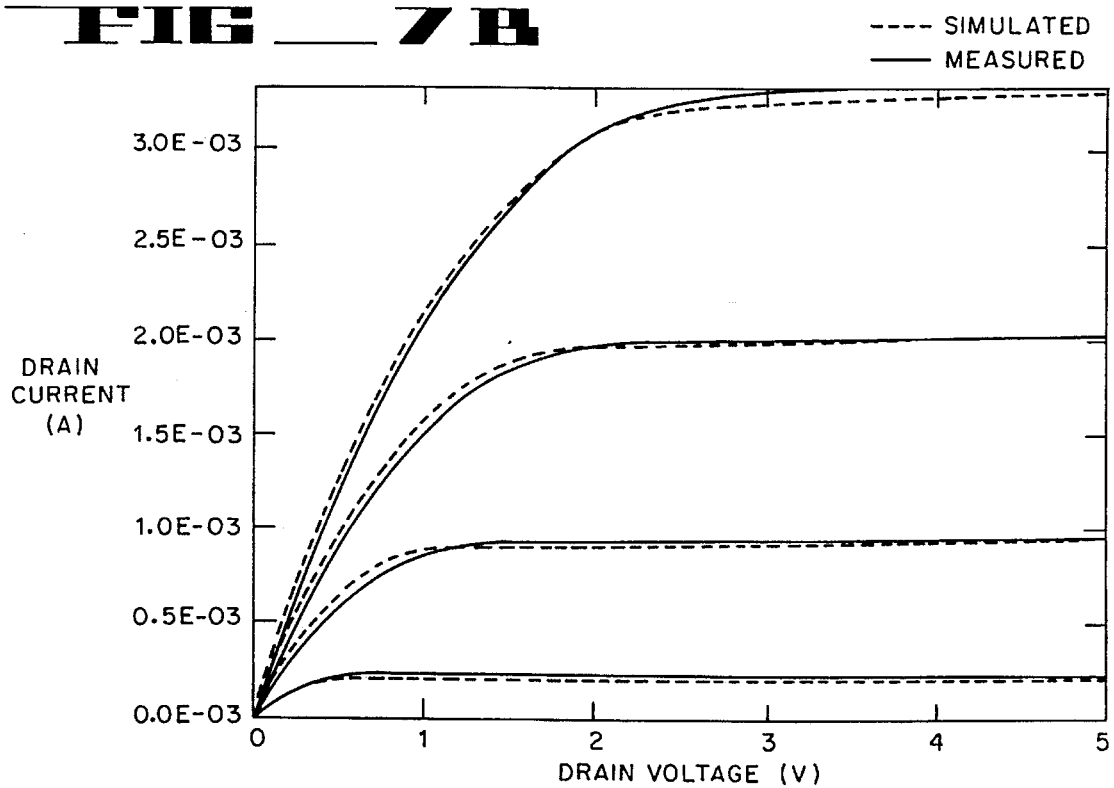
FIG_7B

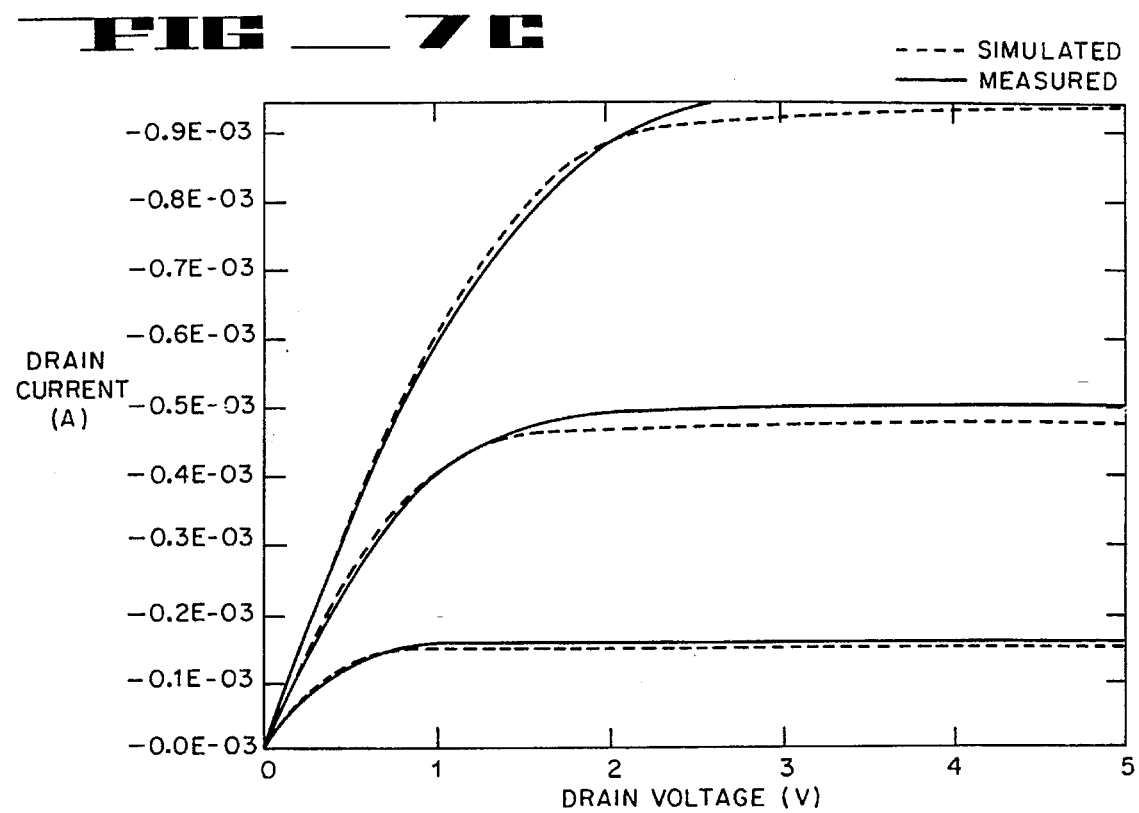

5,580,807

METHOD OF FABRICATING A HIGH VOLTAGE MOS TRANSISTOR FOR FLASH EEPROM APPLICATIONS HAVING A UNI-SIDED LIGHTLY DOPED GRAIN

This is a divisional of application Ser. No. 07/804.093, filed Dec. 6, 1991, now abandoned.

BACKGROUND OF THE INVENTION

1. Field of the Invention

The present invention relates to the field of electrically programmable read-only memories. More particularly, the present invention relates to fabricating high voltage, high reliability transistors in memories employing floating gate memory devices.

2. Art Background

Metal-oxide-semiconductor ("MOS") electrically programmable read-only memories ("EPROMs") frequently use memory cells having electrically isolated gates, typically termed "floating gates ". The floating gates are typically surrounded by a dielectric insulator and formed from a polycrystalline silicon (polysilicon) layer. The electrical insulation is typically provided by a silicon dioxide layer. Information to be stored in the memory cell is stored as electrical charge on the floating gates. Charge is transferred through the silicon dioxide layer to the floating gates by a variety of mechanisms such as avalanche injection, channel injection, tunnelling, etc., depending on the construction of the memory cells. The charge stored on the floating gate affects the surface channel conductivity in the memory cell. If the surface channel conductivity is above a certain level, the memory cell is deemed to be programmed in one binary state. Alternatively, the conductivity is below a different level, the memory cell is deemed to be programmed in the other state.

The memory cells take a variety of forms in the prior art and are in some cases erased by exposing the memory array to ultraviolet radiation. In other cases, the memory cells are electrically erasable, and are termed EEPROMs. An example of a EEPROM memory cell is disclosed in U.S. Pat. No. 4,203,158. The invention disclosed in the present application is used with an electrically erased memory EEPROM cell referred to as a "flash" EEPROM. The flash EEPROM cell used in connection with the present invention is described in co-pending applications Ser. No. 253,775, entitled "Low Voltage EEPROM Cell", filed Oct. 5, 1988 now abandoned, and in Ser. No. 407,645, entitled "Apparatus for Providing Block Erasing in a Flash EPROM", filed Sep. 15, 1989, now U.S. Pat. No. 5,065,364, both assigned to the assignee of the present invention.

Referring briefly to FIG. 1A, a cross-sectional view of a typical prior art floating gate flash EEPROM cell 5 is shown. In FIG. 1A, the flash memory cell 5 is formed on a silicon substrate such as the p-type substrate 15. The flash cell includes a pair of spaced-apart doped regions 12 and 13 disposed in substrate 15. Specifically, region 13 comprises a source, and region 12 comprises a drain, source 13 and drain 12 defining an active silicon region 4 and a channel therebetween. A polysilicon floating gate 10 is disposed above and between drain 12 and source 13 and insulated therefrom by a thin layer of silicon dioxide or other electrically insulative layer 14. Insulative layer 14 is generally known as the gate or tunnel oxide, having a typical thickness of approximately 110 angstroms (Å). The floating gate 10 is insulated from a second control gate 11 disposed above floating gate 10 and insulated therefrom by an interpoly dielectric layer 9. Interpoly dielectric layer 9 may be variously formed of a single layer of silicon dioxide, or of an oxide/silicon nitride/oxide multilayer dielectric of appropriate thickness. The control gate 11 is fabricated from a second layer of polysilicon deposited subsequent to the interpoly dielectric layer 9. In some cases control gate 11 consists of a two-layer stacked structure, having polysilicon deposited on the interpoly dielectric followed by tungsten silicide, the two-layer structure acting to reduce the resistivity of control gate 11. At the completion of processing, floating gate 10 is completely surrounded by dielectric insulative layers, and therefore electrically "floats".

Programming, reading, and erasing of flash memory cells is well documented in the art and are, for example, described at length in the Memory Components Handbook published by Intel. Flash cells are programmed by setting the source 13 to ground or zero volts, connecting the drain to a 7 volt power supply, and raising the control gate 11 to programming voltage equal to 12 volts. Under these nominal conditions, hot electron injection occurs from the channel region between source 13 and drain 12 through the tunnel oxide layer 14. To read a programmed cell, ordinary MOS supply voltages are used wherein the gate potential is raised to 5 volts, and the drain is set slightly positive relative to the source. In contrast to programming the flash cell 5, when erasing a flash cell, the drain 12 is permitted to float, the control gate 11 is grounded, and a potential of approximately +12 volts is connected to the source 13. When thus connected, electric charge is removed from the floating gate 10 through tunnel oxide 14.

Although the flash memory cells themselves may be counted on to reliably be programmed and erased many thousand of times, such reliability is guaranteed in highly scaled flash cell and peripheral transistors because the high programming voltages are only briefly connected to a flash cell and the scaled peripheral transistors. A representative scaled peripheral transistor 6 constructed according to typical prior art methods is shown in FIG. 1B. In FIG. 1B, the peripheral transistor 6 is seen to have a slightly thicker (175 Å) peripheral gate oxide 16 formed of thermal silicon dioxide over active silicon region 7. Thicker peripheral gate oxide 16 does not permit tunneling as in the case of flash cell tunnel oxide 14 (FIG. 1A). Moreover, scaled peripheral transistor 6 has oxide spacers 18, which modify source region 18a and drain region 18b diffusion profiles to include, respectively, tip regions 17a and 17b. The "two-tiered" source-drain structure is frequently used to minimize hot carrier effects in highly scaled devices. The scaled peripheral transistor 6 is turned on or off by connecting appropriate; voltages to peripheral control gate 19. The peripheral control gate 19 is formed of the second polysilicon layer only, dispensing with the first polysilicon layer 10 (FIG. 1A) and the interpoly dielectric layer 9 (FIG. 1A).

If a 12 volt potential were continuously applied to a transistor having only the thin (110 Å) tunnel oxide layer 14 (FIG. 1A) or scaled peripheral gate oxide 16 (FIG. 1B) to withstand the high voltage, degradation of either oxide may be expected to occur after some time due to the extremely high electric field (of order $10^7$ v/cm) impressed across the thin oxide. The foregoing is especially true in cases of the programming voltage source switches which switchably connect the flash cell transistors to the programming voltage high voltage power supplies. Unlike the flash transistors 5 in the array or peripheral transistors 6 in the program or erase circuitry which only briefly see programming or erase voltages when the cell is either programmed or erased, the source switches are constantly, for their lifetimes, exposed to the high programming voltages. Due to constraints in MOS device fabrication, all transistors must be formed at the same time on the chip, regardless of the application of a particular device during operation of the circuit. Heretofore, producing different transistors for different applications including high voltage applications within one circuit has not been problematic to the extent that transistor dimensions have generally been consistent with voltage potentials applied across those transistors.

However, in the quest for ever-smaller devices to increase circuit speed and packing densities, devices are being scaled more and more. Scaling is a collective term referring to procedures wherein circuit dimensions and device structures are shrunk in proportion to one another to produce a smaller device which still functions according to parameters known to be functional on larger unscaled devices. One natural consequence of device scaling is that when all transistor dimensions are reduced, the insulative gate oxide between the substrate channel and the control gate is reduced proportionally. Although reducing the thickness of the gate oxide of the peripheral transistors may be desirable to enhance the performance or size of the flash memory itself, the thinner oxide produced for the scaled array and peripheral devices will be inherently problematic for those peripheral devices exposed to voltages higher than are applied to any of the array cells and for longer periods of time. Again, a leading example of devices which suffer as a result of scaling are the transistors functioning as source switches connecting flash memory cells to the programming voltage power supplies. Whereas the flash memory cell and the majority of peripheral transistors may only be connected to the programming voltage for a few milliseconds to program or erase the cell, the source switch is continuously exposed to the high voltage power supply used for programming and erasing the flash memory cell. Using the scaled peripheral transistor oxide thickness for the source switch gate oxide, source switch reliability cannot be guaranteed in the absence of additional and costly processing to separately fabricate special high voltage transistors to function as the source switches.

A designer designing transistors in a flash application is thus faced with a paradox where some of the transistors must continuously withstand the 12 volt (or higher) potential, but in order to scale peripheral transistors in order to obtain optimal speed and packing density, the gate oxide of the source switch transistors is reduced to the thickness of the peripheral transistor gate oxide, or approximately 175 Å angstroms. Because 175 Å oxides will not reliably sustain 12 volt programming voltages, prior art solutions require extra processing steps to produce peripheral transistors with thicker gate oxide. The paradox is further exacerbated in that only very few high voltage source switches are required in a flash memory in comparison to the large number of array cells and high performance scaled peripheral transistors. Under ordinary cost-benefit analysis, improving switching device reliability could not justify the added complexity, cost and cycle time of the additional special processing required to fabricate extremely few, albeit important, devices.

The present invention discloses a method for producing high voltage transistors contemporaneously with the scaled flash array transistors and scaled peripheral transistors without adding any processing steps or making existing steps more complex. As will be explained in more detail in the following paragraphs, the present invention improves upon the prior art by enabling fabrication of robust non-scaled transistors with thicker gate oxide on the periphery of the flash memory circuit without requiring additional dielectric deposition or definition processing steps. The present invention takes full advantage of the existing prior art processing steps, including masking layers and first and second polysilicon layer thicknesses to produce a thicker gate oxide in the peripheral transistors operating as source switches for the high voltage programming voltages.

SUMMARY OF THE INVENTION

A high voltage metal-oxide-semiconductor transistor incorporating a uni-sided lightly doped drain and methods for fabricating same for switching flash EEPROM programming and erasing control voltages in highly scaled flash EEPROM memory circuits are disclosed. The high voltage transistors are fabricated contemporaneously with the flash array and scaled peripheral transistors without additional steps or complexity using standard metal-oxide-semiconductor (MOS) processing.

Active silicon regions separated by field oxide isolation structures are formed in <100> p-type silicon according to prior art LOCOS methods. Following removal of masking silicon nitride and stress relief silicon oxide layers, a 350 Å sacrificial thermal oxide layer is grown, simultaneously removing residual silicon nitride due to the Kooi effect from active silicon surfaces and providing the gate oxide layer of the devices which will control the 12 volt flash programming and erase voltages. Following a flash cell threshold adjustment implant, a high voltage transistor gate oxide is formed from the sacrificial oxide by preserving the sacrificial oxide in all circuit areas except over the flash array transistor active areas during prior art etching, methods. The sacrificial oxide is protected over high voltage transistors during etching by a photoresist layer defined by an appropriately defined flash cell implant mask.

Following an HF tunnel oxide preclean, growth of a flash cell tunnel oxide layer contributes approximately the amount removed during preclean, resulting in a high voltage transistor gate oxide final thickness of 350 Å. Thereafter, a first polysilicon layer for the floating gates, interpoly dielectric, peripheral gate oxide and a second polysilicon layer for the control gates are then grown in a known manner. The second polysilicon layer is approximately twice as thick (3500 Å) as the first polysilicon layer (1500 Å), and in the preferred embodiment consists of a double layer polysilicon and tungsten silicide (polycide) structure. Patterning of the first and second polysilicon layers and the peripheral gate oxide layer are also accomplished in a known manner, wherein lines formed from the second polysilicon layer are dimensioned so as to protect lines formed from the first polysilicon layer during subsequent oxidation steps.

A uni-sided lightly doped drain (LDD) structure is formed in n-channel high voltage devices by using an appropriate source-drain implant mask. The mask blocks the high dose n+ source-drain implant only over the gate-to-drain region of the high voltage n-channel devices, thereby minimizing hot-carrier effects, while not increasing in the source-to-channel impedance. Finally, metal-to-poly contacts are directly made to the poly 1 lines of the high voltage transistors, the first polysilicon layer acting as the control gate for the high voltage transistors.

BRIEF DESCRIPTION OF THE DRAWINGS

The present invention will be understood more fully from the detailed description given below and from the accompanying drawings of the preferred embodiment of the invention in which:

FIG. 1A is a cross-sectional elevation view of a prior art floating gate flash EEPROM transistor.

FIG. 1B is a cross-sectional elevation view of a prior art scaled peripheral transistor.

FIGS. 3A–E illustrate cross-section views of the high voltage n-channel native transistor shown in FIG. 2A at successive processing steps.

FIG. 3F is a length wise cross-sectional view of the high voltage n-channel native transistor shown in FIG. 3E.

FIGS. 4A–D illustrates a flash array transistor at successive processing steps.

FIGS. 5A–D illustrate a high performance scaled peripheral transistor at successive processing steps.

FIG. 6 a process flow table showing process steps forming the high voltage transistors contemporaneously within the flash array and scaled peripheral transistors.

FIG. 7A illustrates experimental current-voltage characteristics and corresponding simulation data for a representative n-channel native high voltage transistor fabricated according to the present invention.

FIG. 7B illustrates experimental current-voltage characteristics and corresponding simulation data for a representative n-channel enhancement mode high voltage transistor fabricated according to the present invention.

FIG. 7C illustrates experimental current-voltage characteristics and corresponding simulation data for a representative p-channel enhancement mode high voltage transistor fabricated according to the present invention.

DETAILED DESCRIPTION OF THE INVENTION

The present invention describes a high voltage metal oxide-semiconductor ("MOS") transistor structure with a uni-sided lightly doped drain and methods for contemporaneously fabricating the high voltage transistors with scaled flash EEPROM array and scaled peripheral transistors. In the following description, numerous specific details are set forth, such as thicknesses, temperatures, etc., in order to provide a thorough understanding of the present invention. It will, however, be obvious to one skilled in the art that the present invention may be practiced without specific details. In other instances, well known processing steps and well known device structures have not been described in detail in order not to unnecessarily obscure the present invention.

The high voltage transistors of the present invention are fabricated employing standard metal-oxide-semiconductor technology. The particular processing employed is not critical because the present invention is adaptable to any process and application requiring high voltage transistors within a MOS circuit. High voltage transistors may be fabricated as native n-type devices 20 (shown in FIG. 2A), p-type enhancement devices 19 (shown in FIG. 2B), or as n-channel enhancement devices (not shown). N-channel enhancement devices are, except for implant dosage variations, identical to n-channel native devices. The uni-sided lightly doped drain is incorporated into the n-channel and native variants only. In the preferred embodiment, the transistors and method of the present invention are used in conjunction with a process for fabricating a flash EEPROM memory device, or any other device which relies on tunneling of carriers between a substrate and a floating gate.

Throughout the following detailed description, the high voltage transistors and process to fabricate same are principally described in terms of the n-channel native device. Structural and processing differences between native and n-type and p-type enhancement devices are noted where appropriate. Moreover, reference is made to numerous MOS processing steps at various points in the fabrication process. A process flow table is shown in FIG. 6 to aid the reader in obtaining a broad overview of all major processing steps used to obtain the high voltage transistors of the present invention, and may be referred to throughout the following paragraphs.

Figure 2A:
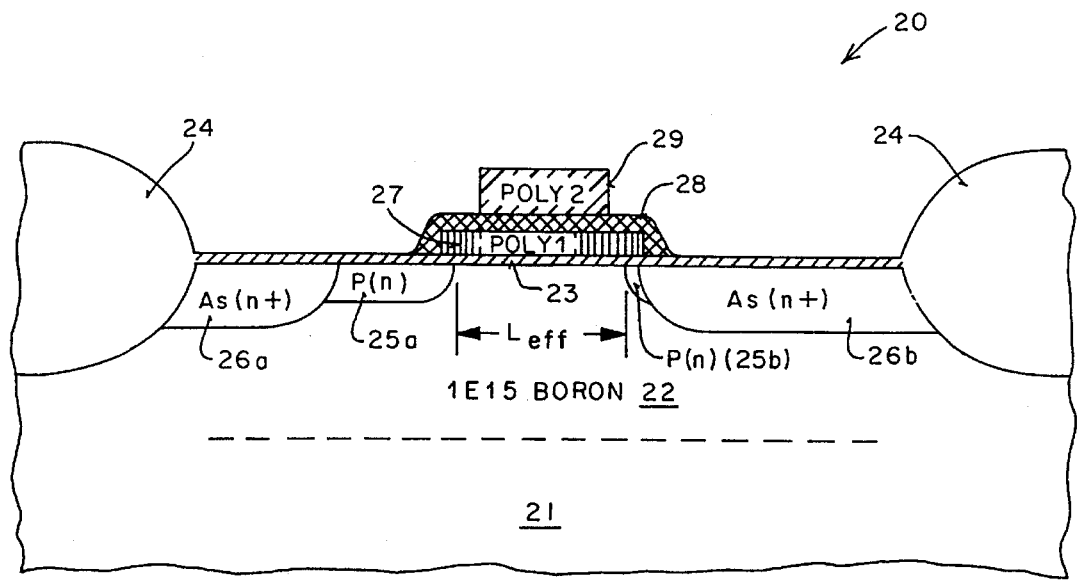
FIG. 2A is a cross-sectional elevation view of a high voltage n-channel native transistor formed according to the presently preferred method disclosed in the present application.

Referring more particularly now to FIG. 2A, a high voltage n-channel native transistor 20 is shown fabricated using the structure and method of the presently preferred embodiment. The transistor 20 is fabricated on a p-type silicon substrate 21 having a crystal orientation of <100> and having a resistivity of 10 to 14 $\Omega$-cm. High voltage transistor 20 is fabricated during processing contemporaneously with flash array transistors 40 (FIG. 4A) and scaled peripheral transistor 50 (FIG. 5A). An active silicon region 22 is formed according to the prior art by using masking silicon nitride and stress relief oxide layers (not shown) to define the active silicon region 22 during a silicon etch. The carrier concentration in active silicon region 22 is approximately 1E15 (carriers per cm$^3$) produced with p-type dopant (Boron). Active silicon region 22 is isolated from active silicon regions of adjacent devices by using known field oxide growth and LOCOS methods. In particular, the field oxide 24 is grown to a thickness of approximately 6500 Å. Following the growth of field oxide 24, the masking silicon nitride and stress relief oxide layers are removed in preparation for growing a thermal tunnel oxide 42 for flash array devices 40 (FIG. 4A). In accordance with generally known MOS processing techniques, due to residual nitridization of the active silicon during field oxidation as first observed by Kooi, a thermal sacrificial oxide 23 is first grown to oxidize any such residual silicon nitride remaining. Central to the present invention is the observation that sacrificial oxide 23 may be of very high quality, and may be grown to any thickness desired. The present invention takes full advantage of the high quality dielectric nature of the thermal sacrificial oxide by growing the sacrificial oxide 23 to a thickness that is commensurate with the gate oxide requirements of the high voltage transistors to be used as source switches for the programming and erase voltages. Thus, growth of sacrificial oxide 23 in the present invention accomplishes a two-fold objection: one is to remove the residual Kooi effect silicon nitride from the active silicon region 22, and the second is to provide what will be the gate oxide for the high voltage transistors 20 formed on the periphery of the flash circuit. As presently preferred, thermal sacrificial oxide 23 is grown to a nominal thickness of 350 Å in a dry oxidation environment. The reader should note that the sacrificial oxide 23 is electrically identical to any high quality thermal oxide grown for gate oxide applications.

Having thus simultaneously removed residual silicon nitride from active regions 22 and grown the insulative layer which will form gate oxide for the high voltage transistors, the sacrificial oxide layer 23 must be eventually removed from all circuit areas except over the high voltage transistors 20. In order to comport with standard flash memory cell processing, sacrificial oxide 23 is first preserved over the high voltage transistor active regions 22 as well as over peripheral transistors by taking advantage of an appropriately patterned photomask used for flash cell threshold adjustment implant. Importantly, the photomask, in addition to defining flash cell regions to be threshold implanted, is also used to define regions where the sacrifidal oxide 23 will eventually remain as gate oxide in high voltage transistor 20. Following the flash cell threshold adjustment implant, sacrificial oxide 23 is then removed from all areas except over active regions 22 using any of several known thermal oxide etch methods, including either wet or dry etches. After sacrificial oxide 23 is removed from the flash memory array, the photoresist mask is stripped and the silicon wafers prepped for oxidation via an HF preclean operation, the HF preclean removing approximately 50 Å from sacrificial oxide 23. The silicon wafers are then placed in a dry oxidation furnace for growth of the tunnel oxide 42 for the flash array transistors 40, shown in width cross-sectional view in FIG. 4A. In accordance with known flash memory processing, the tunnel oxide 42 is grown to a thickness of approximately 115 Å, which coincidently, regains 50 Å to the thickness of sacrificial oxide 23 remaining over the high voltage transistor 20 active regions 22. At this point, all transistor active regions 22 (FIG. 2A), 41 (FIG. 4A), and 52 (FIG. 5A) have been defined and field oxide isolation structures 24 formed. Further, electrically insulative tunnel oxide 42 (FIG. 4A), and sacrificial oxide 23 (FIG. 2A), have been differentially applied to flash memory array cells 40 and high voltage transistors 20. Because sacrificial oxide 23 remains over active region 22 and will function as the gate oxide of high voltage transistor 20, the sacrificial oxide 23 will be henceforth referred to as high voltage gate oxide 23.

Thereafter, a layer of phosphorus-doped polycrystalline silicon (polysilicon), is deposited and photomasked in a known manner. Following photoresist application and patterning, the first layer of polysilicon, or poly 1, is etched to define the floating gates 43 of all the flash array transistors 40 as well as to form the control gates 27 of the high voltage transistors 20. Ordinary flash memory cell array processing would suggest that the poly 1 should be removed from all circuit areas except where floating gates are to be defined. However, in the presently preferred embodiment, the poly 1 forms the active control gate 27 of the high voltage transistor 20, and must therefore be preserved over the high voltage gate oxide 23 previously defined over active regions 22. In other words, poly 1 remains in peripheral circuit regions where it would not normally be found according to prior art teachings. Poly 1 serves a two-fold purpose in the present invention. First, by leaving poly 1 in the peripheral regions, the high voltage gate oxide 23 covering the channel region of high voltage transistors 20 is protected during subsequent etching steps. Secondly, the poly 1 remaining over the high voltage transistors 20 serves as an implant mask during a subsequent $V_t$ threshold adjustment implant for both n-type and p-type high voltage peripheral devices. By retaining poly 1 over the high voltage transistors, the threshold for the high voltage transistors is naturally much higher, due to the much thicker high voltage gate oxide 23 retained beneath poly 1. Thus, convenient threshold voltages may be obtained for high voltage devices without excessively high $V_t$ implant doses. The reader is reminded that the high voltage transistors 20 being formed are not high performance devices as compared to the scaled periphery transistors 50. Rather, the benefit of the high voltage transistors 20 is realized when blocking and switching of the high voltage programming and erase voltages, where such switches are constantly connected to 12 volt supply potential.

After defining the poly 1, an interpoly dielectric layer is grown comprising silicon dioxide of an appropriate thickness. Preferably, an oxide/nitride/oxide sandwich layer, typically referred to as the ONO layer 44, may be grown as shown in width cross-sectional view in FIG. 4B. Having deposited the interpoly ONO dielectric layer 44, a photoresist layer is applied and patterned to permit removal of the interpoly dielectric from all areas except over flash array transistors 40. In particular, interpoly ONO dielectric layer 44 is cleared entirely from the peripheral regions including over the high voltage transistors 20. At this point, a thermal peripheral gate oxide 28 is grown to a thickness of approximately 175 Å, from which is formed the peripheral transistor gate dielectric 58 (FIG. 5B) for all scaled peripheral devices 50 (FIG. 5B). In regions where the high voltage transistors 20 are being formed, the peripheral gate oxide 28 covers the entire device, including the control gate 27. Because the control gate 27 is centrally located between the source and drain to be formed for high voltage transistor 20 and on top of high voltage gate oxide layer 23, peripheral gate oxide 28 grown over control gate 27 is naturally conformal to it without requiring additional patterning or etching.

With brief reference to FIGS. 3B and 5B, the 175 Å peripheral gate oxide, 28 is located immediately above the channel of active region 52 of peripheral transistor 50, whereas high voltage gate oxide layer 23 appears above active region 22 in high voltage transistor 20 (FIG. 3A–B). Control gate 27 will not be present in the scaled peripheral high performance transistors 50 (FIGS. 5A–D), poly 1 being removed over scaled high performance transistor 50 during the etch process used to form high voltage control gates 27 (FIGS. 2A and 3A). Instead, a peripheral transistor gate 59 for scaled high performance transistors 50 will be formed of a second polysilicon (poly 2) layer (not yet deposited), over the peripheral gate oxide 28 just described.

The second polysilicon layer (referred to as poly 2) is now deposited, and in the preferred embodiment constitutes a two-layer structure consisting of a layer of polysilicon and a layer of tungsten silicide. Poly 2 forms the control gates 45 for all flash memory array cell transistors 40, shown in length cross-sectional view in FIG. 4C. Poly 2 also forms the active control gates 59 for the scaled high performance transistors on the periphery of the flash circuit as shown in FIGS. 5C and 5D. Although poly 2 is physically the same material used to form control gates 45 of flash cell transistors 40 and gates 59 of scaled peripheral transistors 50, the poly 2 is separately masked and etched to produce the separate structures. In particular, the flash cell control gates 45 are first defined via appropriate photolithography and etching steps. The peripheral transistor gates 59 are thereafter similarly defined.

Figure 2B:
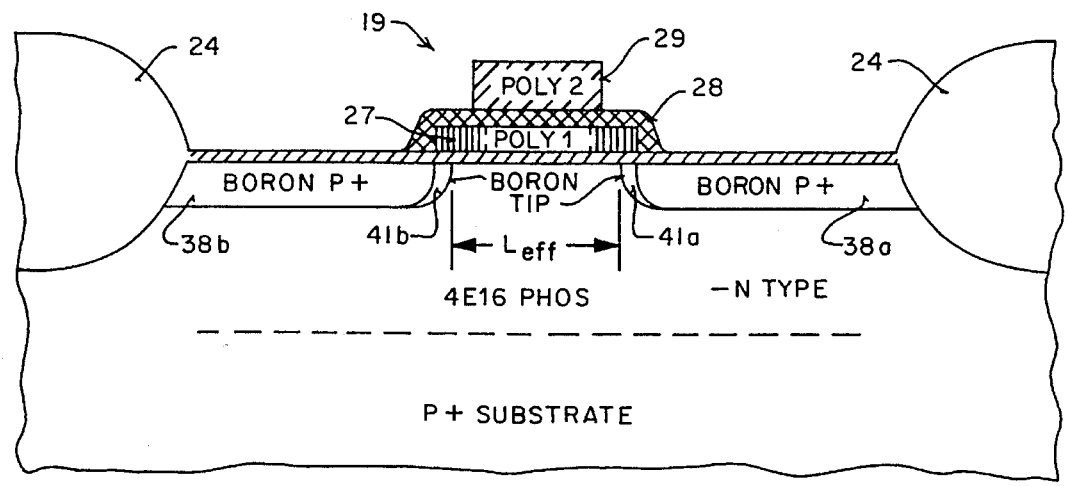
FIG. 2B is a cross-sectional elevation view of a high voltage p-channel transistor formed according to the presently preferred method disclosed in the present application.

Poly 2 is further used to good advantage in the high voltage transistors 20, as will now be described. Although poly 2 is not used to form an electrically active structure in high voltage transistors 20, the poly 2 lines 29, as finally patterned and etched as shown in FIGS. 2a, 2b and 3c, perform an implant mask function during subsequent tip implant and source-drain implant steps. Preventing undesired tip and source-drain implant penetration through the thin poly 1 into the channel has two beneficial effects in the high voltage transistors 20: it more precisely controls final channel length ($L_{eff}$), and also prevents the device thresholds from being altered.

Referring to the first function, poly 2 lines 29 serve to block inadvertent dopant penetration to the channel formed in active region 22 between the tip regions 25b and 25a of source 26b and drain 26a during subsequent tip and source-drain implants. Effectively excluding tip regions 25a and 25b from the region beneath poly 2 lines 29 help ensure that the effective gate length (shown as $L_{eff}$) of the high voltage transistors 20 is not appreciably narrowed. FIG. 3C shows tip regions 25a and 25b immediately following the tip implant.

Referring to the second principal feature of the present invention, the novel uni-sided LDD, will now be discussed. Ordinarily in MOS device fabrication, self-aligned source and drain regions are produced by uniformly implanting the particular dopant species required in the areas where the sources or drains are to be formed using previously defined gates and control lines to mask the implanted dopant. Self-aligned sources and drains are, for example, shown in FIGS. 2B (source 38a and drain 38b), 4C (source 47a and drain 47b) and 5C (source 58a and drain 58b). Tip implants regions 41a and 41b (FIG. 2B), and 57a and 57b (FIG. 5C) are seen to be self-aligned as well. Generally, considerable overlap occurs onto surrounding regions, including the gates of the MOS devices. Although self-aligned sources and drains are desirable for array or scaled peripheral transistors, in high voltage applications the self-aligned symmetrical sources and drains can lead to undesirable hot carrier effects, without proper LDD formation, especially in highly scaled devices. The hot carrier phenomena are well documented in the literature, the reader being referred to, for example, Sze, *Physics of Semiconductor Devices* (2d. Ed. 1981) and Wolf, *Silicon Processing for the VLSI Era*, Vol 2. (1990). Prior art known methods for reducing hot carrier effects and resultant hole-electron pair generation include using oxide spacers on lateral sides of the control gate to partially block a source-drain implant following the tip implant which precedes it. However, the optimum LDD formation for the highly scaled peripheral transistors illustrated in FIG. 5C does not occur in the high voltage transistors (FIG. 2A) due to the scaled poly 1 thickness which is optimized for the FLASH EEPROM cell. Unless additional processing steps and processing complexity are employed to grow an additional oxide layer and properly form an LDD structure for the high voltage transistors, the reliability of the high voltage transistors will be compromised. Additionally, in transistors having a symmetrical LDD structure, although the hot carrier effect is reduced in the drains, the source-to-channel impedance is increased, resulting in reduced gate to source voltage and hence reduced current drive.

The present invention avoids both additional complexity and symmetrical LDD formation by employing poly 2 lines 29 in combination with an appropriately defined dark field mask used during high dose source-drain implants to form an asymmetrical source-drain structure, here termed a uni-sided LDD. Inasmuch as the dark field mask is used to implant the sources and drains of all n-channel devices, it is no additional hardship to form the openings in the dark field mask in an appropriate fashion to skew the implant to the drain side only of the high voltage transistor 20. The appropriately shaped opening in the dark field source drain implant mask is synthesized by logically determining an area wherein the source-drain implant should not extend, using as references the boundaries of the active control gates 27 formed of the poly 1 lines and a "Source ID" layer attached by the circuit designer to the "source side" of the dark field mask openings. Thus, the photomask may be numerically synthesized without additional effort on the designer's part, or requiring an additional masking and attendant photolithography steps in creating an asymmetrical source-drain implant relative to the active control gate 27. With reference to FIG. 3D, it is seen that the source-drain dopant species is implanted uniformly over the high voltage transistors 20 except where photoresist 34 defined by the specially synthesized dark field mask excludes the ion stream. The uni-sided LDD is formed only in n-channel and native high voltage devices. P-channel transistor 19 (FIG. 2B), does not have a uni-sided LDD for reasons explained below, and therefore receives a uniform source-drain implant.

Reviewing briefly with reference to FIGS. 2A–2B, 3C–D, and FIG. 5C, after poly 2 lines 29 have been defined, the uni-sided LDD is formed. Phosphorus and boron tip implants are performed to form tip regions 25a–b and 41a–b in n-channel transistor 20 and p-channel transistor 19, respectively. Boron tip implants are masked. Thereafter, an LDD oxide is deposited and defined in a known manner to form lateral LDD oxide spacers 55 in scaled peripheral transistors as shown in FIG. 5C. It should be noted that oxide spacers are also vestigially present in high voltage transistor 20, but are too small to affect operation of high voltage transistor 20. Finally, high-dose n+ source and drain regions 26b and 26a are masked for n-channel high voltage transistors 20, the masking photoresist 34 defined as shown in FIG. 3D for both n-channel native and enhancement devices. P-channel devices are entirely masked during the n+ source-drain implant, and thus receive no implant dose. Because the photoresist 34 applied to n-channel enhancement and native devices is physically offset relative to previously defined poly 2 lines 29, the high-dose n+ implant is skewed on the drain side only, resulting in the source-drain implant profiles shown in FIGS. 2A and 3D. Following the n+ source-drain implant, photoresist 34 is stripped and the wafers recoated and defined for p+ source-drain implant. Following the p+ implant, p-channel high voltage transistor 19 is characterized by source 38a and drain 38b extending laterally away from tip regions 41a and 41b adjoining the channel (FIG. 2B). As previously set forth, p-channel high voltage transistors 19, are not fabricated with the LDD feature and thus receive laterally symmetrical p+ implants. The novel uni-sided LDD produces a lower electric field in the drain side of the high voltage transistor 20, thereby reducing hot carrier degradation of high voltage transistor gate oxide 23 during the operation of the transistor. Moreover, the uni-sided LDD structure of high voltage transistor 20 avoids inclusion of a large higher impedance region 25b in source 26b, analogous to tip implant region 25a found in drain 26a. Instead, as shown in FIGS. 2A and 3D, a significantly shorter tip implant region 25b is produced by allowing the source-drain arsenic (As) implant to be self-aligned to the poly 1 on the source side of high voltage transistor 20. Therefore, a very small LDD structure 25b is produced on the source side, the higher dose As source implant 26b governing the source-channel impedance.

In the foregoing, the purpose of the shrunk-back poly 2 lines 29 can be seen to be two-fold. Firstly, poly 2 acts as an implant block for the tip and source-drain implants as described above where the poly 2 prevents the implants from penetrating into the active channel. Secondly, poly 2 protects the poly 1 lines beneath from excessive oxidation during certain subsequent processing steps. In the presently preferred embodiment, poly 1 sheet resistance is approximately 4000 ohms per square as deposited. Even slight overetching of poly 1 can unacceptably increase this already high value. Thus, high voltage n-channel native and enhancement transistors are formed according to the illustration in FIG. 2A, wherein it is seen that the source 26b n+ region extends substantially to the right edge of the channel, there being only a small phosphorous region 25b remaining from the earlier tip implant operation. Conversely, the n+ drain 26a region extends only partially to the channel, the lower concentration n tip 25a completing the electron path from the channel to the drain. Accordingly, it will be appreciated that hot electron effects can be avoided with the present uni-sided LDD, while at the same time avoiding a high impedance strip between the source 26b and the channel. The reader is again reminded that the uni-sided LDD structure is produced only in the n-channel native high voltage transistors 20 (FIG. 2A) and the n-channel enhancement high voltage transistor (not shown) of an MOS flash memory circuit, but that such uni-sided LDD may be implemented according to the teachings of the present invention for use in any high voltage MOS application.

It should be noted that the structure of the presently preferred high voltage transistor 20 does not require buried contacts to make contact between poly 1 control gate 27 and substrate 21 as shown in FIG. 2A. Consequently, metallization is made directly to poly 1 control gate 27 over field oxide 24 by a contact metal 31 through an appropriate passivation layer 35, as shown in FIGS. 3E–F. The added benefit of direct-to-poly 1 metallization is that buried contacts processing is not required for contact to poly 1 which would normally be the case for an EPROM or EEPROM process technology. The elimination of buried contacts reduces processing complexity. As presently preferred, it is only necessary to make an appropriately sized opening onto the poly 1 control gate 27 through the above layers, and thereafter depositing a suitable contact metal 31, such as aluminum, as shown in FIGS. 3E and 3F. Further, because poly 1 control gate 27 is merely a control line and not a current line, it is not necessary that a large opening be produced. Rather, even a slight ring-like contact which produces any ohmic contact whatsoever will suffice to make high voltage transistor 20 functional. In the cases of flash array transistor 40 (FIGS. 4A–D) and scaled peripheral transistor 50 (FIGS. 5A–D), metallization is made to poly 2 lines 45 and 59, respectively, through passivation layer 35 using the same contact metal 31.

The high voltage transistors of the present invention may be produced in n-channel (FIG. 2A), p-channel (FIG. 2B) and native (FIG. 3A–3E) variants. Construction of all three variants is essentially identical subject to the following exceptions. Principally, the difference between n-channel and p-channel device fabrication is that n-channel devices are formed within p-wells, whereas p-channel devices are formed within n-wells. N-channel enhancement devices are created identically as native devices except that the enhancement device receives a p-well implant early in the process, compared to no p-well implant for the native device. In contrast, native devices rely on the intrinsic background concentration of carriers present in the substrate. Thus, as presently preferred, native devices have a conduction threshold of approximately 0.1 volts compared to the n-channel enhancement device threshold of 1.1 volts. Further, LDD structures are not fabricated in p-channel devices, but are generally not a detriment due to smaller hot carrier effects in p-channel devices stemming from lower hole mobility.

The reader will appreciate that the present invention functionally permits the construction of up to 6 different device types on one monolithic chip, without requiring any additional deposition, masking, or etching steps or process complexity. The six devices which may be fabricated according to the present invention are high voltage transistors in n-channel, p-channel and native varieties, n-channel and p-channel scaled high performance peripheral devices, and the flash memory array cell itself. The present invention, in effect, permits a doubling of the number of device types which may be produced with a single process technology for no additional process complexity, cost or cycle time.

Referring now to FIGS. 7A–7C, exemplary current-voltage curves are shown illustrating representative experimental results obtained from test high voltage native, and n-channel and p-channel enhancement devices, constructed to the teachings of the present invention. Further, in FIGS. 7A–7C, the experimental data are compared to theoretical process simulation models predicting the data actually obtained. The measured operational characteristics of all high voltage transistors are seen to be within 10% of predicted values. Accordingly, transistors constructed to the teachings of the present invention may be readily incorporated into any MOS hardware design and process application.

The foregoing has described a high voltage metal-oxide-semiconductor transistor incorporating a uni-sided lightly doped drain and methods for fabricating same for switching flash EEPROM programming and erasing control voltages in highly scaled flash EEPROM memory circuits. It is contemplated that changes and modifications may be made by one of the ordinary skill in the art, to the materials and arrangements of elements of the present invention without departing from the spirit and scope of the invention.

We claim:

1. A process for fabricating a floating gate memory circuit, said circuit comprising high voltage transistors, floating gate array transistors and peripheral transistors in a silicon substrate of a first conductivity type, said process comprising the steps of:

defining array active regions, peripheral transistor active regions and high voltage transistor active regions in said silicon substrate, said defining step including the steps of disposing a first mask over said substrate, forming a field oxide over said substrate and removing said first mask wherein a residue remains over said substrate after said removing step;

forming a first oxide layer on said array active regions and said high voltage transistor active regions to form a high voltage transistor gate insulator comprising said first oxide layer wherein said formation of said first oxide layer contemporaneously removes said residue from said array active regions;

removing said first oxide layer from said array active regions, said first oxide layer removed from portions of said array active regions to be source regions, drain regions, and channel regions;

forming an array gate insulator in said array active regions;

forming a floating gate on said array gate insulator;

forming a high voltage transistor control gate on said high voltage transistor gate insulator;

forming an array control gate over said floating gate;

forming a peripheral transistor control gate over said peripheral active regions wherein said floating gate and said high voltage transistor control gate comprise a first conductive layer and said array control gate and said peripheral transistor control gate comprise a second conductive layer; and forming a masking member disposed above said high voltage transistor control gate, said masking member defining a high voltage transistor channel region in said substrate, wherein said masking member comprises said second conductive layer.

2. The method as set forth in claim 1, wherein a first patterning layer is formed to define said high voltage transistor gate insulator, said first patterning layer further defining threshold adjustment implant regions for said array transistors, said process further comprising the step of performing an array threshold adjustment implant in said threshold adjustment implant regions.

3. The method as set forth in claim 1 wherein said first oxide layer is grown to a thickness of approximately 350 Å.

4. The method as described in claim 1 further comprising steps of:

forming an array integrate insulator on said floating gate; wherein said array control gate is formed on said array integrate insulator; and forming a peripheral transistor gate insulator on said peripheral transistor active region and on said high voltage transistor gate;

wherein said peripheral transistor control gate is formed on said peripheral transistor gate insulator, said array integrate insulator being different from said peripheral transistor gate insulator.

5. The method as described in claim 1 wherein said first conductive layer comprises a first polysilicon layer and said second conductive layer comprises a second polysilicon layer.

6. The method as set forth in claim 5 wherein said first polysilicon layer is deposited to a thickness of 1500 Å.

7. The method as described in claim 5 wherein said first and said second polysilicon layers are deposited to a thickness of approximately 1500 Å, and wherein said second conductive layer further comprises a layer of tungsten silicide.

* * * * *